United States Patent
Kato et al.

(10) Patent No.: US 8,491,101 B2
(45) Date of Patent: Jul. 23, 2013

(54) LIQUID EJECTING HEAD AND LIQUID EJECTING APPARATUS

(75) Inventors: Jiro Kato, Suwa (JP); Satoshi Denda, Suwa (JP); Yoko Miyazawa, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 95 days.

(21) Appl. No.: 12/983,441

(22) Filed: Jan. 3, 2011

(65) Prior Publication Data

US 2011/0164093 A1 Jul. 7, 2011

(30) Foreign Application Priority Data

Jan. 6, 2010 (JP) ................................. 2010-001593

(51) Int. Cl.
  *B41J 2/045* (2006.01)
  *H01L 41/04* (2006.01)

(52) U.S. Cl.
  USPC ............................................ 347/68; 310/367

(58) Field of Classification Search
  USPC ........................ 310/367; 252/62.9 R, 62.9 PZ
  See application file for complete search history.

(56) References Cited

U.S. PATENT DOCUMENTS

| 2006/0012279 A1 | 1/2006 | Nanataki et al. |
| 2008/0043069 A1 | 2/2008 | Shimada et al. |
| 2010/0007705 A1 | 1/2010 | Morozumi et al. |
| 2010/0020135 A1 | 1/2010 | Morozumi et al. |

FOREIGN PATENT DOCUMENTS

| EP | 2104153 A2 | 9/2009 |
| JP | 2003-127366 | 5/2003 |
| JP | 2008-311290 | 12/2008 |
| JP | 2009-076819 A | 4/2009 |
| JP | 2010-021375 | 1/2010 |
| JP | 2010-030129 | 2/2010 |

OTHER PUBLICATIONS

Extended European Search Report dated Apr. 11, 2011 as issued in connection with corresponding European Patent Application No. 11150067.4.

*Primary Examiner* — Matthew Luu
*Assistant Examiner* — Lisa M Solomon
(74) *Attorney, Agent, or Firm* — Workman Nydegger

(57) ABSTRACT

A piezoelectric element comprising a first electrode, a piezoelectric layer which contains lead, zirconium, and titanium, and which is formed above the first electrode, and a second electrode formed above the piezoelectric layer. A groove which exists between grains in the second electrode side surface of the piezoelectric layer, satisfies $0 \leq d/\rho \leq 0.900$ (where d: depth of groove, w: width of groove, $\rho$: radius of curvature $(d^2+w^2/4)/2d$).

4 Claims, 16 Drawing Sheets

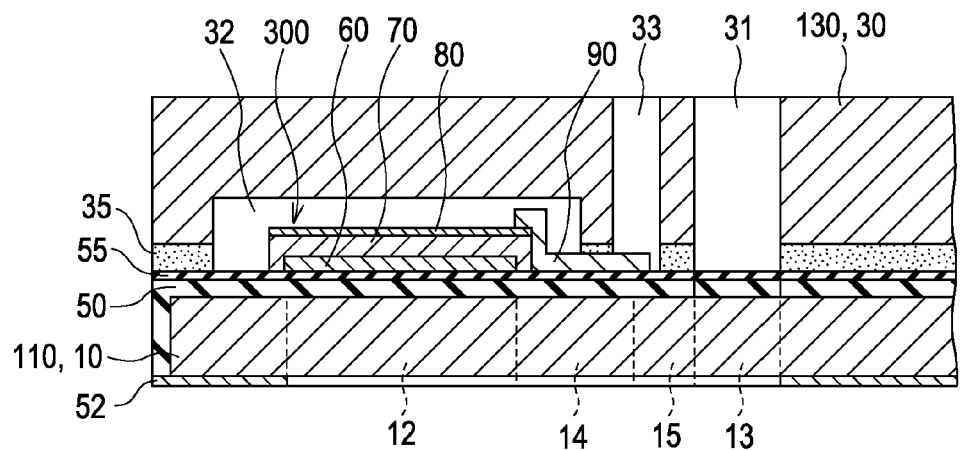
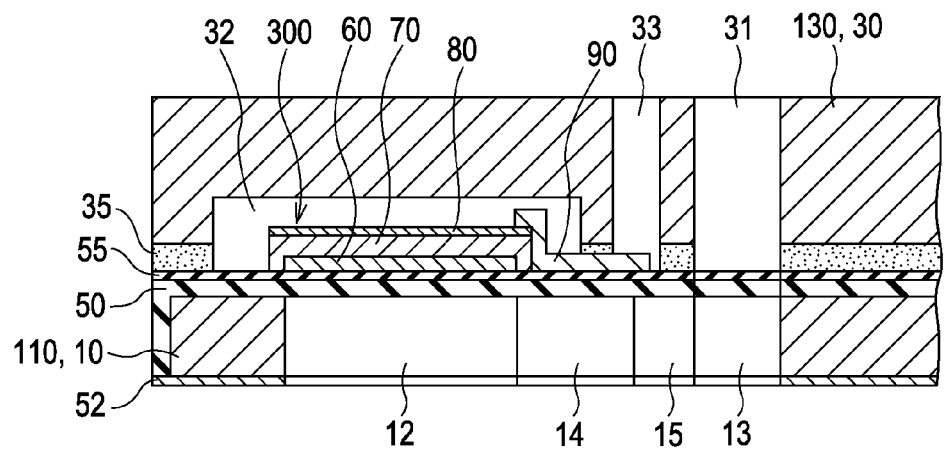

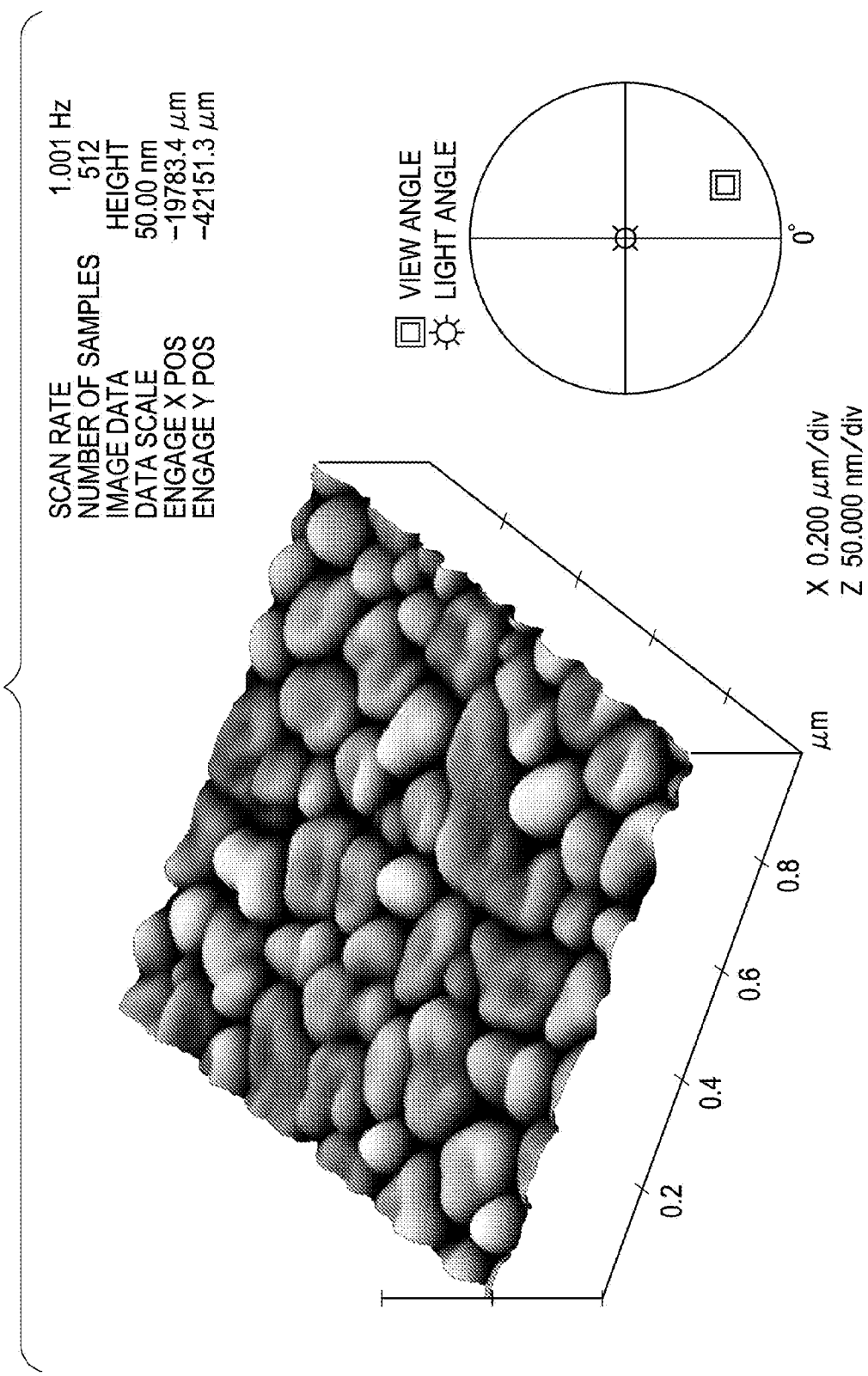

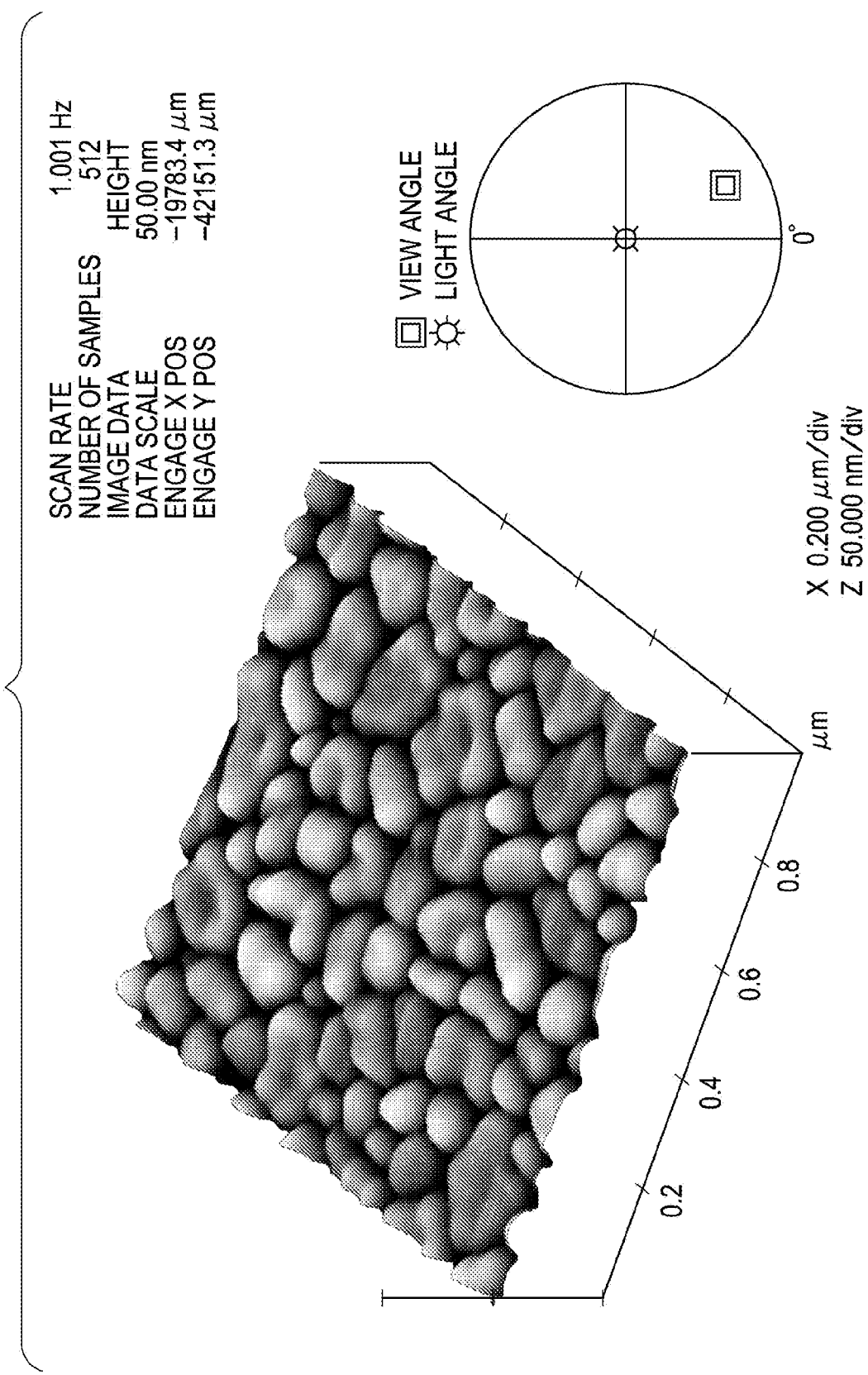

LIQUID EJECTING HEAD AND LIQUID EJECTING APPARATUS

CROSS-REFERENCE TO RELATED APPLICATIONS

This application claims the benefit of priority to Japanese Patent Application No. 2010-001593 filed Jan. 6, 2010, the contents of which are hereby incorporated by reference in their entirety.

BACKGROUND

1. Technical Field

The present invention relates to a liquid ejecting head which ejects liquid from nozzle openings and a liquid ejecting apparatus.

2. Related Art

As a piezoelectric element used in a liquid ejecting head, there is a piezoelectric element which is configured by interposing between two electrodes a piezoelectric layer formed of a piezoelectric material having an electromechanical conversion function, for example, a crystallized dielectric material. Such a piezoelectric element is mounted in a liquid ejecting head as, for example, an actuator device of a flexural vibration mode. As a representative example of a liquid ejecting head, for example, there is an ink jet recording head wherein a part of a pressure generating chamber, which communicates with nozzle openings which discharge ink, is configured by a vibrating plate, and the vibrating plate is deformed by a piezoelectric element to pressurize ink in the pressure generating chamber, thus discharging ink droplets from the nozzle openings.

As the piezoelectric element mounted in such an ink jet recording head, for example, there is the piezoelectric element formed so as to be independent for each pressure generating chamber by forming a uniform piezoelectric material layer using film deposition technology over the entire surface of the vibrating plate, and cutting the piezoelectric material layer into shapes corresponding to the pressure generating chambers using a lithographic method (refer to JP-A-2003-127366).

In the piezoelectric element, stress acts on the piezoelectric layer when a voltage is applied, and when this happens, there is a problem in that cracks may be generated in the piezoelectric layer. In particular, in the case when the piezoelectric layer is formed as a thin film using a thin film deposition method such as a solution deposition technique or a CVD method, which is different to a so-called bulk piezoelectric layer formed by sintering grains of metal oxide, the problem of the generation of cracks becomes pronounced due to stress acting on the piezoelectric element becoming large. Here, a problem such as this is not limited to ink jet recording heads and also occurs in liquid ejecting heads which eject other liquids.

SUMMARY

An advantage of some aspects of the invention is that there is provided a liquid ejecting head, which suppresses the generation of cracks in a piezoelectric layer, and a liquid ejecting apparatus.

According to an aspect of the invention, there is provided a liquid ejecting head including pressure generating chambers which communicate with nozzle openings, and a piezoelectric element which generates changes in pressure in the pressure generating chambers and which is provided with a first electrode, a piezoelectric layer which contains lead, zirconium, and titanium, and is formed on the first electrode, a second electrode formed on the opposite side of the piezoelectric layer to the first electrode, wherein a groove portion, which exists between grains in the second electrode side surface of the piezoelectric layer, satisfies $0 \leq d/\rho \leq 0.900$ (where d: depth of groove, w: width of groove, $\rho$: radius of curvature $(d^2+w^2/4)/2d$).

According to the present aspect, the generation of cracks in the piezoelectric layer when a voltage is applied can be suppressed, and a liquid ejecting head has superior durability.

In addition, the thickness of the piezoelectric layer may be 6 μm or less. It is easier for cracks to be generated as the thickness of the piezoelectric layer becomes thinner due to larger stress acting on the piezoelectric layer. However, according to this configuration, even with a thin piezoelectric layer of 6 μm or less, the generation of cracks can be suppressed.

Also, according to another aspect of the invention, there is provided a liquid ejecting apparatus including the liquid ejecting head of the aspect described above. According to the present aspect, it is possible to realize a liquid ejecting apparatus which includes a liquid ejecting head with a piezoelectric element which suppresses the generation of cracks in the piezoelectric layer.

BRIEF DESCRIPTION OF THE DRAWINGS

The invention will be described with reference to the accompanying drawings, wherein like numbers reference like elements.

FIGS. 9A and 9B are cross sectional diagrams illustrating manufacturing processes of the recording head according to the first embodiment of the invention.

FIG. 10 is an AFM image of a piezoelectric layer of a piezoelectric element A.

FIG. 11 is an AFM image of a piezoelectric layer of a piezoelectric element B.

DESCRIPTION OF EXEMPLARY EMBODIMENTS

Hereinafter, an embodiment of the invention will be described in detail.

First Embodiment

Figure 1:
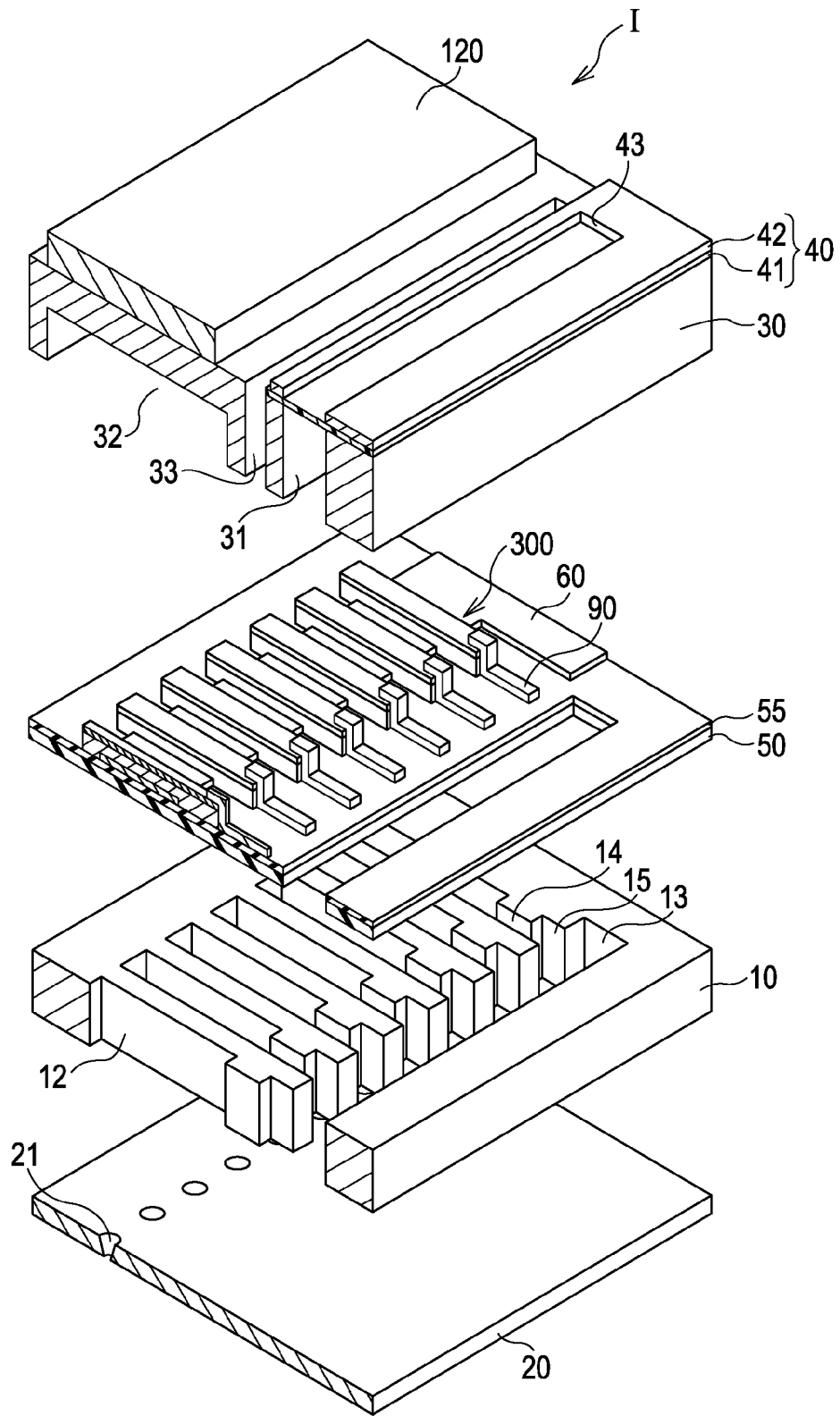
FIG. 1 is an exploded perspective diagram illustrating a schematic configuration of a recording head according to a first embodiment of the invention.
Figure 2A:
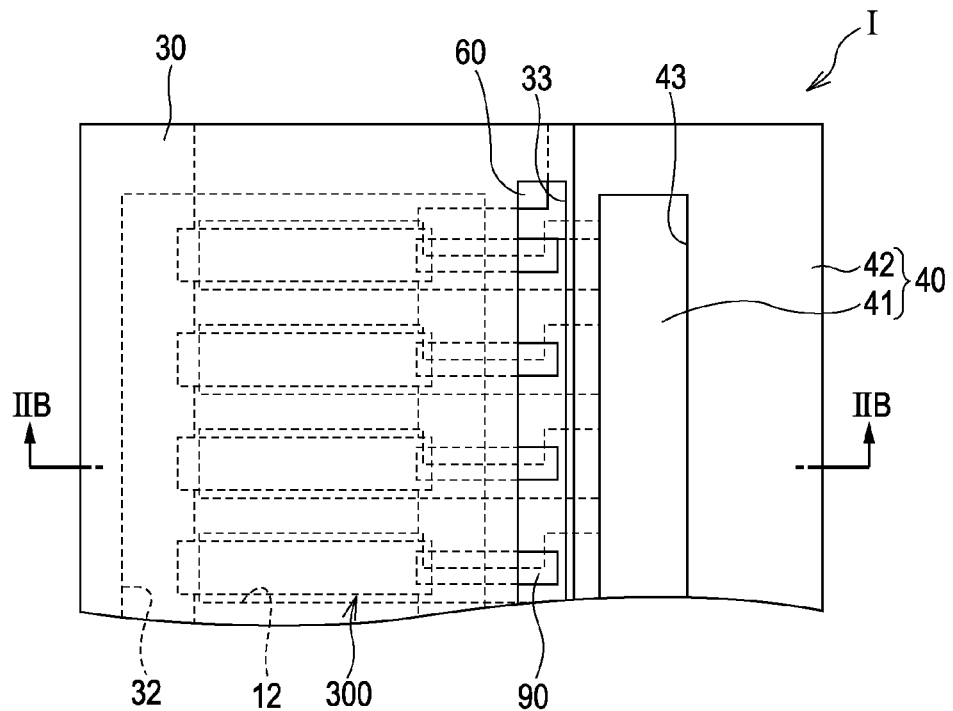
FIGS. 2A and 2B are respectively a planar diagram and a cross sectional diagram of the recording head according to the first embodiment of the invention.
Figure 2B:
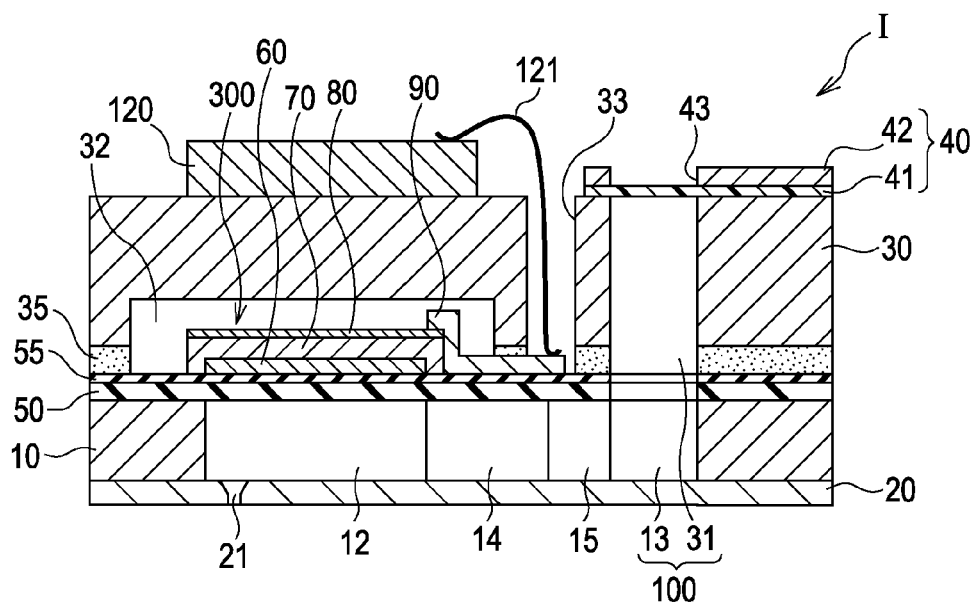
Figure 3:
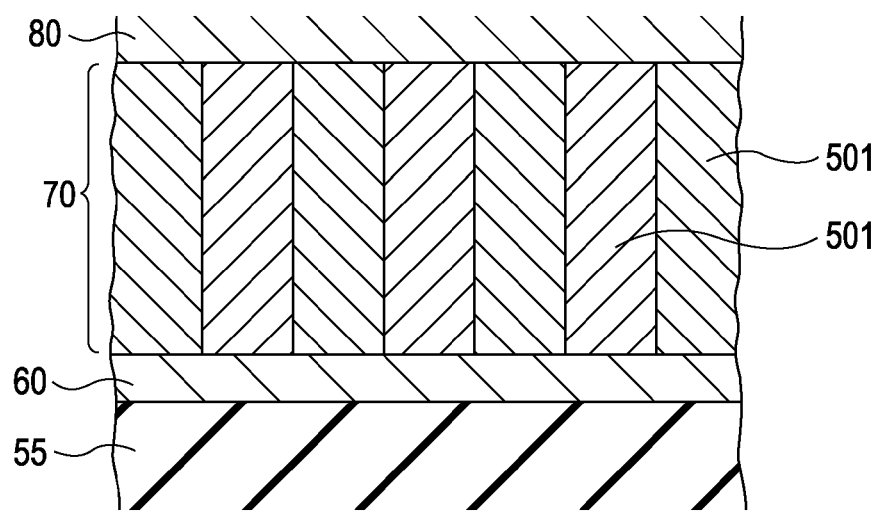
FIG. 3 is an enlarged cross sectional diagram of main sections of the recording head according to the first embodiment of the invention.

FIG. 1 is an exploded perspective diagram illustrating a schematic configuration of an ink jet recording head which is an example of a liquid ejecting head according to a first embodiment of the invention. FIG. 2A is a planar diagram of FIG. 1 and FIG. 2B is a cross sectional diagram taken along line IIB-IIB of FIG. 1. FIG. 3 is a cross sectional diagram which enlarges main sections of the ink jet recording head.

As shown in FIGS. 1, 2A and 2B, a flow path forming substrate 10 of the embodiment is formed from a single crystal silicon substrate, and on one surface thereof, an elastic film 50 is formed from silicon dioxide.

In the flow path forming substrate 10, a plurality of pressure generating chambers 12 is arranged in a line in the width direction thereof. Also, in a region on the outside in the longitudinal direction of the pressure generating chamber 12 of the flow path forming substrate 10, a communication section 13 is formed. The communication section 13 and each of the pressure generating chambers 12 communicate via ink supply paths 14 and communication paths 15 provided for each of the pressure generating chambers 12. The communication section 13 communicates with a reservoir section 31 of a protective substrate which will be described later, and configures a part of a reservoir which is an ink chamber shared by each of the pressure generating chambers 12. The ink supply paths 14 are formed with a width narrower than that of the pressure generating chambers 12 and maintain a constant flow path resistance with regard to ink flowing into the pressure generating chambers 12 from the communication section 13. Here, in the embodiment, the ink supply paths 14 are formed by narrowing the width of the flow path from one side. However, the ink supply paths may be formed by narrowing the width of the flow path from both sides. Also, the ink supply paths may be formed, not by narrowing the width of the flow path, but by narrowing in the thickness direction. Here, in the embodiment, in the flow path flowing substrate 10, a liquid flow path is provided which is formed of the pressure generating chambers 12, the communication section 13, the ink supply paths 14 and the communication paths 15.

Also, in the opening surface side of the flow path forming substrate 10, a nozzle plate 20, which is provided with nozzle openings 21 which communicate with the vicinity of the edge portion of each of the pressure generating chambers 12 on the side opposite to the ink supply paths 14, is attached by an adhesive, a heat adhesion film or the like. Here, the nozzle plate 20 is formed of, for example, glass ceramics, a silicon single crystal substrate, stainless steel or the like.

On the other hand, on the side opposite to the opening surface of the flow path forming substrate 10, the elastic film 50 described above is formed, and on the elastic film 50, an insulating film 55 is formed. Furthermore, on the insulating film 55, a laminated layer is formed of a first electrode 60 formed of platinum, iridium or the like, a piezoelectric layer 70 formed in a thin film with a thickness of 6 μm or less, or more preferably, a thickness of 0.3 μm to 1.5 μm, and a second electrode 80 formed of iridium or the like, and this configures a piezoelectric element 300. Here, the piezoelectric element 300 is a portion including the first electrode 60, the piezoelectric layer 70 and the second electrode 80. Generally, any one of the electrodes of the piezoelectric element 300 is configured as a common electrode, and the other electrode and the piezoelectric layer 70 are configured by being patterned for each of the pressure generating chambers 12. In the embodiment, the first electrode 60 is the common electrode of the piezoelectric element 300, and the second electrode 80 is the individual electrode of the piezoelectric element 300. However, there are no obstacles to reversing this due to the circumstances of the driving circuit or the wirings. Also, here, the combination of the piezoelectric element 300 and a vibrating plate displaced by the driving of the piezoelectric element 300 is referred to as an actuator device. Here, in the example described above, the elastic film 50, the insulating film 55 and the first electrode 60 function as the vibrating plate, but the vibrating plate is of course not limited to this, and for example, the elastic film 50 and the insulating film 55 may be not provided, and just the first electrode 60 may function as the vibrating plate. Also, the piezoelectric element 300 itself may function as the vibrating plate in practice.

The piezoelectric layer 70 is formed on the first electrode 60 from a piezoelectric material showing an electromechanical conversion function, in particular, from among piezoelectric materials, a ferroelectric material which has a perovskite structure and contains Pb, Zr and Ti as metals. For example, a ferroelectric material such as lead zirconate titanate (PZT) or a material, where metal oxide such as niobium oxide, nickel oxide, magnesium oxide, or the like is added, is preferable as the piezoelectric layer 70. Specifically, lead zirconate titanate $(Pb(Zr, Ti)O_3)$, lead lanthanum zirconate titanate $((Pb, La)(Zr, Ti)O_3)$, lead magnesium niobate-lead zirconate titanate $(Pb(Zr, Ti)(Mg, Nb)O_3)$ and the like can be used.

Also, as shown in FIG. 3 which is a cross sectional diagram in the thickness direction of the piezoelectric element 300, in the piezoelectric layer 70, a plurality of grains 501 are formed with column shapes continuous in the thickness direction of the piezoelectric layer 70. Here, a grain refers to a crystal region with the same crystalline orientation.

Figure 4:
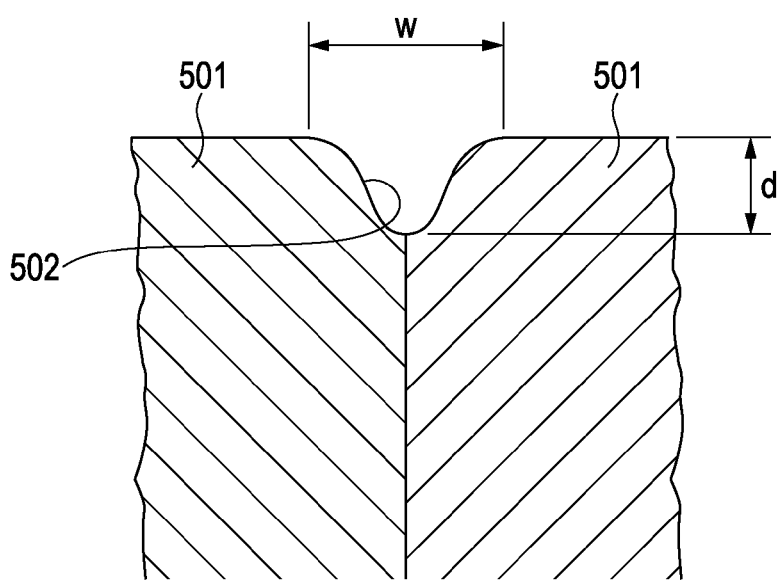
FIG. 4 is an enlarged cross sectional diagram of main sections of a piezoelectric layer.

In addition, as shown in FIG. 4 which is an enlarged cross sectional diagram of the piezoelectric layer 70, the plurality of grains 501 exist in the surface on the second electrode 80 side of the piezoelectric layer 70, and as the grain 501 is typically not formed to have no gap with the adjacent grain 501 up to the surface, a groove portion 502 is formed which is indented from the surface of the piezoelectric layer 70 due to the adjacent grains 501. In addition, in the embodiment, the groove portion 502 satisfies $0 \leq d/\rho \leq 0.900$. In the formula, d is the depth of the groove portion 502, w is the width of the groove portion 502, and ρ is the radius of curvature, that is, $(d^2+w^2/4)/2d$. The method of measuring the depth d and the width w of the groove portion 502 is not particularly limited and an atom force microscope (AFM) or a scanning probe microscope (SPM) can be used, for example, for the measuring by the conditions described below. Here, in regard to the measurement conditions described below, the depth d and the width w are measured by setting the average value of the height in the thickness direction to zero in the measurement range, and the zero of the flat surface is used as a reference.

Measurement Conditions

Device name: Nanoscope III (manufactured by Digital Instruments Inc.)

AFM tip: NCH (tip shape: PointProbe with length of 125 μm, spring constant of 42 N/m, resonance frequency of 320 kHz)

Measurement mode: AC mode (tapping mode)

Measurement range: 5 μm×5 μm

Measurement resolution: 1064×1064

Also, in the case where the plurality of the groove portions 502 are formed in the second electrode 80 side surface of the piezoelectric layer 70, it is sufficient if the averaged value of $d/\rho$ of each of the groove portions 502 satisfies $0 \leq d/\rho \leq 0.900$.

In this manner, in the embodiment, as the groove portions 502 which exist between the grains 501 in the second electrode 80 side surface of the piezoelectric layer 70 satisfy $0 \leq d/\rho \leq 0.900$, the generation of cracks in the piezoelectric layer 70 is significantly suppressed as shown in the Applied Example described later. Here, when a voltage is applied to the piezoelectric element 300 and the piezoelectric element 300 is driven, stress acts on the piezoelectric layer 70, and due to this, it becomes easy for cracks to be generated in the piezoelectric layer 70. In addition, the region in the piezoelectric layer 70, where there is significant stress when a voltage is applied, is not limited to the groove portions 502 formed between the grains 501 in the second electrode 80 side surface, but several such regions exist, such as at grooves formed between the adjacent grains 501 and the like on the first electrode 60 side surface of the piezoelectric layer 70, low density portions which are caused by unevenness in ceramics, typical points which appear in a burning interface in the liquid layer process, and the like. However, the generation of cracks in the piezoelectric layer 70 is hardly influenced by the grooves formed between the adjacent grains 501 and the like on the first electrode 60 side surface of the piezoelectric layer 70, the low density portions which are caused by unevenness in ceramics, the typical points which appear in a burning interface in the liquid layer process, and the like. It has been found that the generation of cracks depends on the groove portions 502 formed between the grains 501 in the second electrode 80 side surface of the piezoelectric layer 70. For example, when a voltage is applied, there is considerably greater stress acting in gaps formed by the existence of foreign matter compared to the groove portions 502 which exist between the grains 501 in the second electrode 80 side surface of the piezoelectric layer 70, but it is difficult for cracks to be generated in the gaps formed by the existence of foreign matter.

In addition, in the case when the piezoelectric layer is formed as a thin film using a thin film forming method such as a solution technique or a CVD method, which is different to a so-called bulk (thick film) piezoelectric layer formed by sintering grains of metal oxide, it becomes easy for cracks to be generated as considerable stress acts on the piezoelectric layer 70 compared to a thick film when a voltage is applied. However, in the embodiment, as the groove portions 502 which exist between the grains 501 in the second electrode 80 side surface of the piezoelectric layer 70 satisfy $0 \leq d/\rho \leq 0.900$, even with the thin piezoelectric layer 70 with a thickness of 6 μm, the generation of cracks can be suppressed and the ink jet recording head has superior durability.

In each of the second electrodes 80 which are the individual electrodes of the piezoelectric element 300, a lead electrode 90 is connected which is formed of, for example, gold (Au) or the like, and is drawn out from the vicinity of the edge portion of the ink supply path 14 side to extend to above the insulating film 55.

On the flow path forming substrate 10 where the piezoelectric element 300 is formed, that is, on the first electrode 60, the insulating film 55 and the lead electrode 90, a protective substrate 30, which has the reservoir section 31 which configures at least a part of a reservoir 100, is bonded via an adhesive 35. In the embodiment, the reservoir section 31 penetrates through the protective substrate 30 in the thickness direction and is formed to span over the width direction of the pressure generating chambers 12. As described above, the reservoir section 31 communicates with the communication section 13 of the flow path forming substrate 10, and configures the reservoir 100 which is an ink chamber shared by each of the pressure generating chambers 12. Also, the communication section 13 of the flow path forming substrate 10 may be divided into a plurality for each of the pressure generating chambers 12 and only the reservoir section 31 may function as the reservoir. Furthermore, for example, only the pressure generating chambers 12 may be provided in the flow path forming substrate 10, and ink supply paths 14 may be provided in a member (such as the elastic film 50, the insulating film 55 and the like) interposed between the flow path forming substrate 10 and the protective substrate 30 so as to communicate with each of the pressure generating chambers 12 and the reservoir.

Also, in a region opposing the piezoelectric element 300 of the protective substrate 30, a piezoelectric element holding section 32 is provided which has a gap so that movement of the piezoelectric element 300 is not hindered. It is sufficient if the piezoelectric element holding section 32 has a gap so that movement of the piezoelectric element 300 is not hindered, and the gap may or may not be tightly sealed.

As the protective substrate 30, it is preferable to use a material with substantially the same rate of thermal expansion as the flow path forming substrate 10, for example, glass, a ceramic material or the like, and in the embodiment, to form the protective substrate 30, a single crystal silicon substrate is used which is the same material as for the flow path forming substrate 10.

Also, in the protective substrate 30, a through hole 33 is provided which passes through the protective substrate 30 in the thickness direction. In addition, the vicinity of the edge portion of the lead electrodes 90, which are drawn out from each of the piezoelectric elements 300, is arranged so as to be exposed in the through hole 33.

Also, on the protective substrate 30, a driving circuit 120 is fixed in order to drive the piezoelectric elements 300 which are arranged in a line. As the driving circuit 120, for example, a circuit substrate, a semiconductor integrated circuit (IC) or the like can be used. In addition, the driving circuit 120 and the lead electrode 90 are electrically connected via connection wiring formed of conductive wire such as a bonding wire 121.

Also, on the protective substrate 30, a compliance substrate 40 is bonded which is formed from a sealing film 41 and a fixing substrate 42. Here, the sealing film 41 is formed from a material with low rigidity and flexibility, and one surface of the reservoir portion 31 is sealed by the sealing film 41. Also, the fixing substrate 42 is formed from a comparatively hard material. Since a region of the fixing substrate 42 opposing the reservoir 100 becomes an opening section 43 which has been completely removed in the thickness direction, one surface of the reservoir 100 is sealed only by the sealing film 41 having flexibility.

In the ink jet recording head I of the embodiment, after ink is input from an ink introduction port connected to an external ink supply means (not shown) and the inside is filled up by ink from the reservoir 100 until it reaches the nozzle openings 21, a voltage is applied between each of the first electrodes 60 and the second electrodes 80 which correspond to the pressure generating chambers 12, according to recording signals from the driving circuit 120, and due to the elastic film 50, the insulating film 55, the first electrode 60 and the piezoelectric layer 70 bending and deforming, the pressure inside each of the pressure generating chambers 12 is increased, thereby ink droplets are discharged from the nozzle openings 21. In addition, in the embodiment, as the generation of cracks can be suppressed even using a voltage of 35 V which is the voltage typically used for ink jet recording heads, effective driving can be performed at 35 V or less and the liquid ejecting head is reliable.

Next, an example of a manufacturing method of an ink jet recording head of the embodiment will be described with reference to FIGS. 5A to 9B. Here, FIGS. 5A to 9B are cross sectional diagrams of the pressure generating chamber in the longitudinal direction.

Figure 5A:
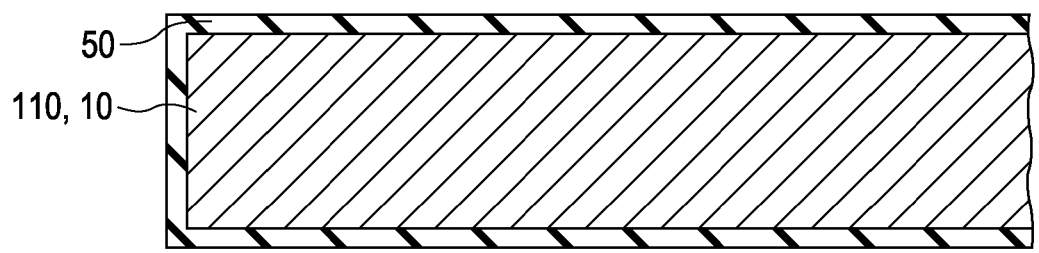
FIGS. 5A and 5B are cross sectional diagrams illustrating manufacturing processes of the recording head according to the first embodiment of the invention.
Figure 5B:
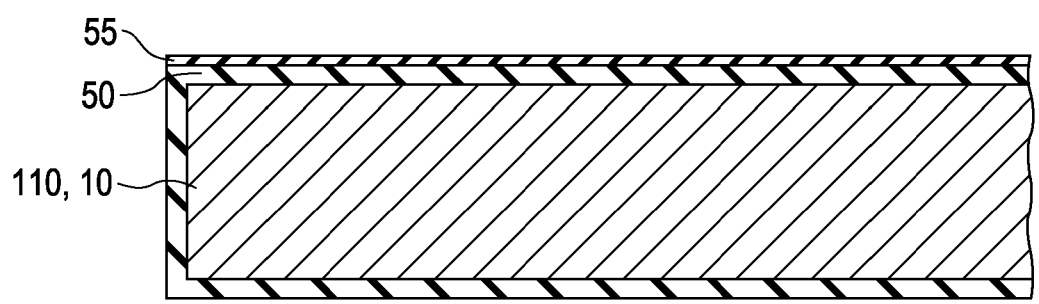
Figure 6A:
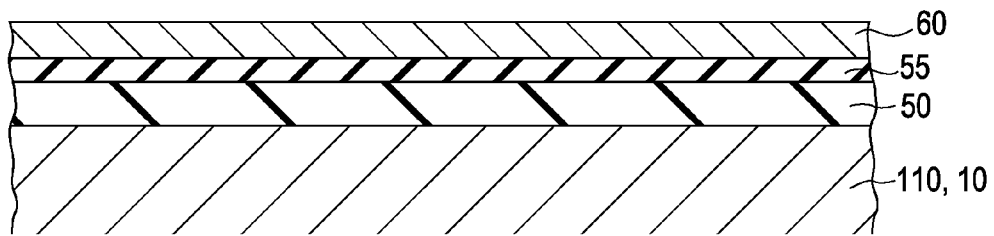
FIGS. 6A to 6C are cross sectional diagrams illustrating manufacturing processes of the recording head according to the first embodiment of the invention.

Firstly, as shown in FIG. 5A, using thermal oxidation or the like, a silicon dioxide film is formed from silicon dioxide ($SiO_2$) or the like which configures the elastic film 50 on the surface of the flow path forming substrate wafer 110 which is a silicon wafer. Next, as shown in FIG. 5B, on the elastic film 50 (silicon dioxide film) the insulating film 55 is formed from zirconium oxide or the like by reactive sputtering, thermal oxidation or the like. Next, as shown in FIG. 6A, the first electrode 60 is formed over the entire surface of the insulating film 55 from platinum, iridium or the like using DC sputtering or the like.

Next, the piezoelectric layer 70 is laminated over the entire upper surface of the first electrode 60. The manufacturing method of the piezoelectric layer 70 is not particularly limited as long as it is a so-called thin film forming method where a thin film of the piezoelectric layer 70 can be formed. However, for example, the piezoelectric layer 70 can be formed using an MOD (metal-organic decomposition) method where a solution formed by dissolving and dispersing a metal-organic compound in a solvent is applied and dried and is then burned at a high temperature to obtain the piezoelectric layer 70 formed of a metal oxide. Here, the manufacturing method of the piezoelectric layer 70 is not limited to an MOD method, and for example, a sol-gel method, a laser ablation method, a sputtering method, a pulsed laser deposition (PLD) method, a CVD method, an aerosol deposition method and the like may be used, and a liquid phase deposition method or a solid phase deposition method may be used.

Figure 6B:
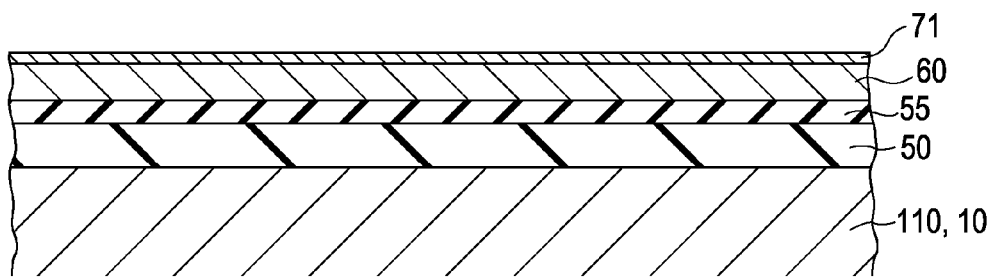

As an example of a specific formation sequence of the piezoelectric layer 70, firstly, as shown in FIG. 6B, on the first electrode 60, a piezoelectric precursor film 71 is formed (coating process) by coating an MOD solution or a Sol (precursor solution), which contains a metal-organic compound, specifically, a metal-organic compound containing lead, zirconium, and titanium in a predetermined ratio, using a spin coating method or the like.

The precursor solution for coating mixes a metal-organic compound containing each of lead, zirconium, and titanium, and this mixture is made into a solution or a dispersion using an organic solvent such as alcohol. As the metal-organic compound containing each of lead, zirconium, and titanium, for example, metal alkoxide, an organic acid salt, a β-diketone complex or the like can be used.

Next, the piezoelectric precursor film 71 is heated to a predetermined temperature and dried for a specific period (drying process). Next, the dried piezoelectric precursor film 71 is degreased by being heated to and held at a predetermined temperature for a specific period of time (degreasing process). The degreasing used here is a discharging of organic components contained in the piezoelectric precursor film 71 as, for example, $NO_2$, $CO_2$, $H_2O$ and the like. The atmosphere during the drying process and the degreasing process is not limited, and performing the process may be carried out in air or inert gas.

Figure 6C:
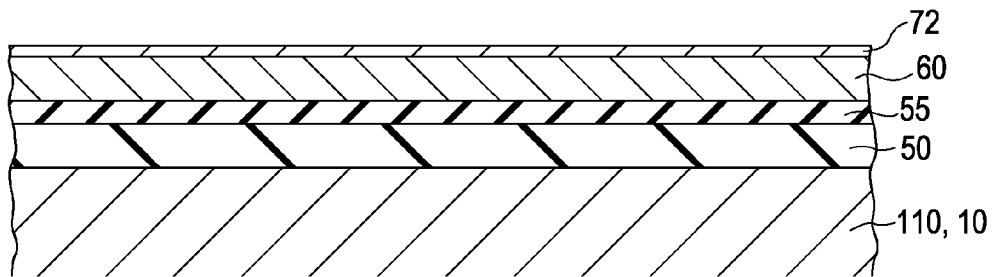

Next, as shown in FIG. 6C, the piezoelectric precursor film 71 is crystallized by being heated to and held at a predetermined temperature, such as approximately 600 to 800° C., for a specific period in an inert gas atmosphere, to form a piezoelectric film 72 (burning process).

Here, as the heating device used in the drying process, the degreasing process and the burning process, for example, an RTA (Rapid Thermal Annealing) device which heats using irradiation of an infrared lamp, a hot plate or the like can be used.

Figure 7A:
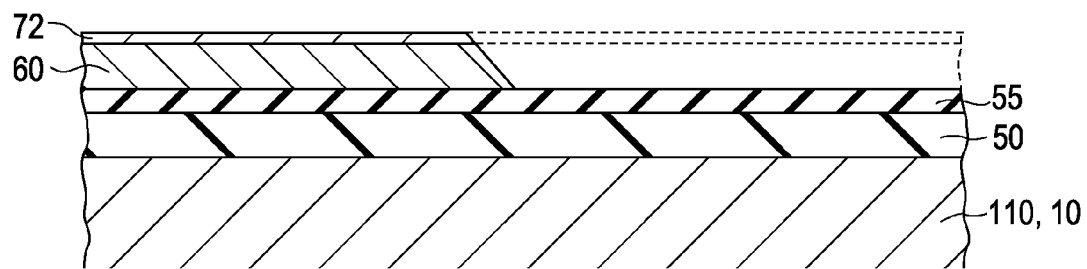
FIGS. 7A and 7B are cross sectional diagrams illustrating manufacturing processes of the recording head according to the first embodiment of the invention.

Next, as shown in FIG. 7A, the first electrode 60 and the first layer of the piezoelectric film 72 are simultaneously patterned so that their side surfaces are inclined with a resist (not shown) with a predetermined shape on the piezoelectric film 72 as a mask.

Figure 7B:
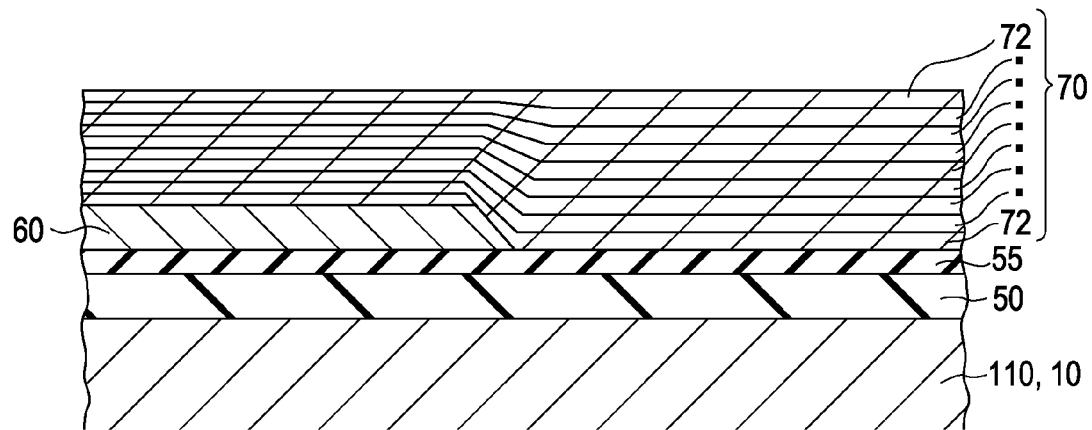

Next, after the resist is peeled off, the piezoelectric layer 70 is formed from a plurality of the piezoelectric films 72 using the above described coating process, drying process, and degreasing process or the coating process, drying process, degreasing process and burning process being repeated plural times according to a predetermined thickness and the like. Thus, as shown in FIG. 7B, the piezoelectric layer 70 with a predetermined thickness is formed from a plurality of layers of the piezoelectric film 72. For example, in the case where the film thickness is approximately 0.1 μm for each coating solution, for example, the film thickness of the whole of the piezoelectric layer 70 which is formed from 10 layers of the piezoelectric film 72 is approximately 1.1 μm. Here, in the embodiment, the piezoelectric film 72 is provided as a laminate but may be provided as a single layer only.

In the embodiment, at this stage, that is, at the stage where the piezoelectric precursor film 71 is crystallized and the piezoelectric film 72 is formed, there are the plurality of grains 501 with column shapes continuous in the thickness direction in the surface on the side where the second electrode 80 is formed, and the groove portions are formed due to the adjacent grains 501. Here, the shape and size of the groove portions 502 which exist in the surface of the second electrode 80 side of the piezoelectric layer 70, that is, the depth d, the width w and the radius of curvature $(d^2+w^2/4)/2d$ of the groove portions 502, can be adjusted, by adjusting the temperature of the burning process, the degreasing process, or the drying process, adjusting the amount of lead, adjusting the density of the grains 501 by providing a layer containing titanium on the insulating film 55 or the like, and on that layer, providing the piezoelectric precursor film 71, also by breaking up the uppermost surface of the piezoelectric layer 70 by strong reverse sputtering, or by grinding, CMP (chemical-mechanical polishing) or the like. For example, if the burning temperature is increased, d/ρ can be reduced although this depends on the balance with other manufacturing conditions. Also, depending on the balance with other manufacturing conditions, the amount of lead can be reduced, and if the uppermost surface of the piezoelectric layer 70 is broken up by strong reverse sputtering or grinding is performed, the depth d of the groove portions 502 can be made shallower.

Figure 8A:
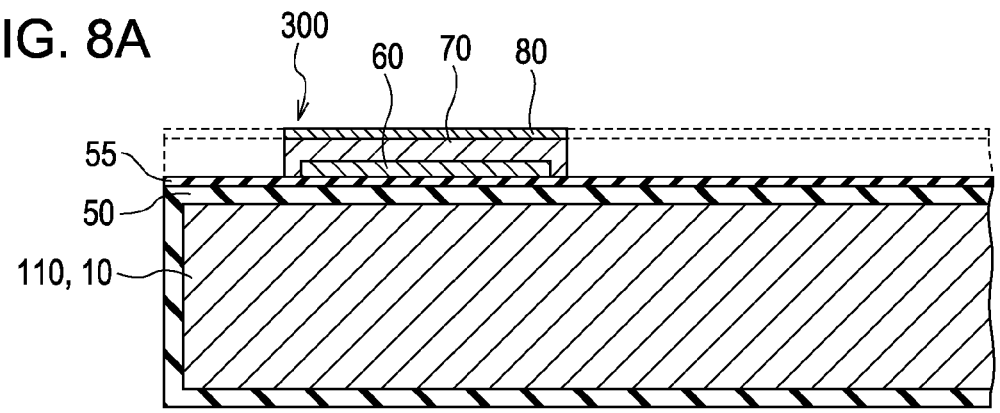
FIGS. 8A to 8C are cross sectional diagrams illustrating manufacturing processes of the recording head according to the first embodiment of the invention.

After the piezoelectric layer 70 is formed in this way, as shown in FIG. 8A, the second electrode 80 is formed from platinum or the like on the piezoelectric layer 70 by sputtering or the like, and in a region opposing each of the pressure generating chambers 12, each of the piezoelectric layer 70 and the second electrode 80 is patterned to form the piezoelectric element 300 formed by the first electrode 60, the piezoelectric layer 70 and the second electrode 80. Here, the patterning of the piezoelectric layer 70 and the second electrode 80 can be performed together by dry etching through a resist (not shown) formed in a predetermined shape.

Next, if required, post annealing may be performed at a temperature in the region of 600 to 800° C. Due to this, an excellent interface can be formed between the piezoelectric layer 70 and the first electrode 60 or the second electrode 80, and the crystalline properties of the piezoelectric layer 70 can be improved.

Figure 8B:
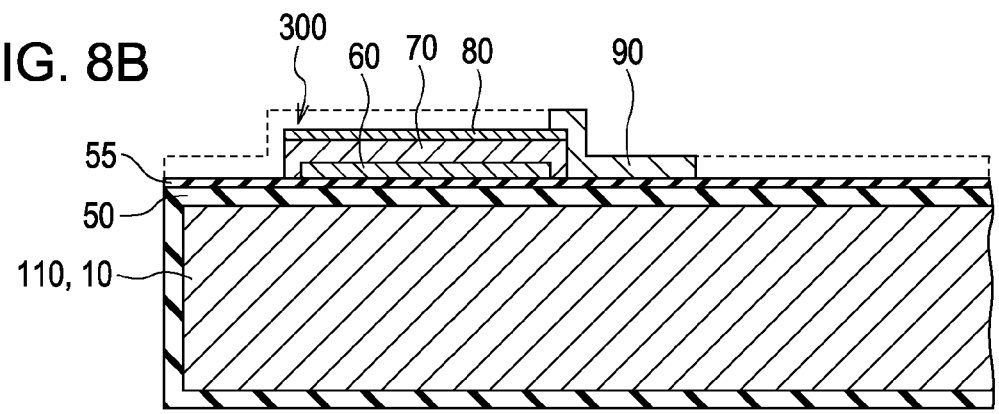

Next, as shown in FIG. 8B, after forming the lead electrode 90 from, for example, gold (Au) or the like, patterning for each of the piezoelectric elements 300 is performed through a mask pattern (not shown) formed of, for example, a resist or the like.

Figure 8C:
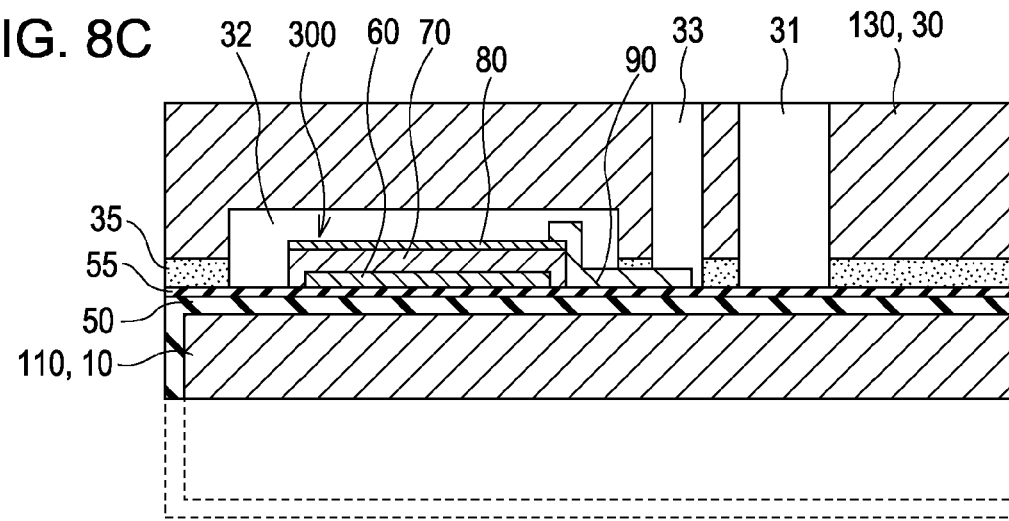

Next, as shown in FIG. 8C, after a protective substrate wafer 130, which is a silicon wafer and becomes a plurality of the protective substrates 30, is bonded to the piezoelectric element 300 side of the flow path forming substrate wafer 110 by the adhesive 35, the flow path forming substrate wafer 110 is thinned to a predetermined thickness.

Next, as shown in FIG. 9A, on the flow path forming substrate wafer 110, a mask film 52 is newly formed and patterned in a predetermined shape. Then, as shown in FIG. 9B, the pressure generating chambers 12, the communication section 13, the ink supply paths 14, the communication paths 15 and the like corresponding to the piezoelectric element 300 are formed, by performing anisotropic etching (wet etching) using an alkaline solution such as KOH or the like on the flow path forming substrate wafer 110 through the mask film 52.

Next, unnecessary sections of the edge portion of the outer circumference of the flow path forming substrate wafer 110 and the protective substrate wafer 130 are removed by cutting by, for example, dicing or the like. Then, after the mask film 52 is removed from the surface on the side opposite to the flow path forming substrate wafer 110 and the protective substrate wafer 130, the nozzle plate 20 provided with the nozzle openings 21 is bonded and the compliance substrate 40 is bonded to the protective substrate wafer 130, and the ink jet recording head I of the embodiment is made by dividing up the flow path forming substrate wafer 110 and the like into single chip sizes of the flow path forming substrate 10 and the like as shown in FIG. 1.

Applied Example

Hereinafter, an applied example is shown and the invention is described in further detail. Here, the invention is not limited by the applied example below.

According to the embodiment described above, five types of piezoelectric elements A to E were formed by changing the burning temperature or amount of lead of the piezoelectric layer 70 on the substrate. Specifically, on the elastic film 50 provided by thermal oxidation of a silicon substrate (the flow path forming substrate 10), the insulating film 55 formed from zirconium oxide was provided. Next, on the insulating film 55, the first electrode 60 was formed from platinum with a film thickness of 130 nm and iridium with a film thickness of 5 nm by sputtering. Then, on the first electrode 60, a titanium layer (type of titanium) was formed of titanium, and on the titanium layer, the piezoelectric layer 70 with a thickness of 1.3200 μm was formed from 12 layers of the piezoelectric film 72 through the coating process, drying process, degreasing process, and burning process using a precursor solution with a metal-organic compound containing each of lead, zirconium, and titanium. When the cross sections of the thickness direction of the piezoelectric layer 70 of each of the piezoelectric elements A to E were studied, the piezoelectric layers 70 were formed by the plurality of grains 501 with column shapes continuous in the thickness direction, and there were groove portions 502 between the adjacent grains 501 in the surface of the piezoelectric layers 70.

Figure 12:
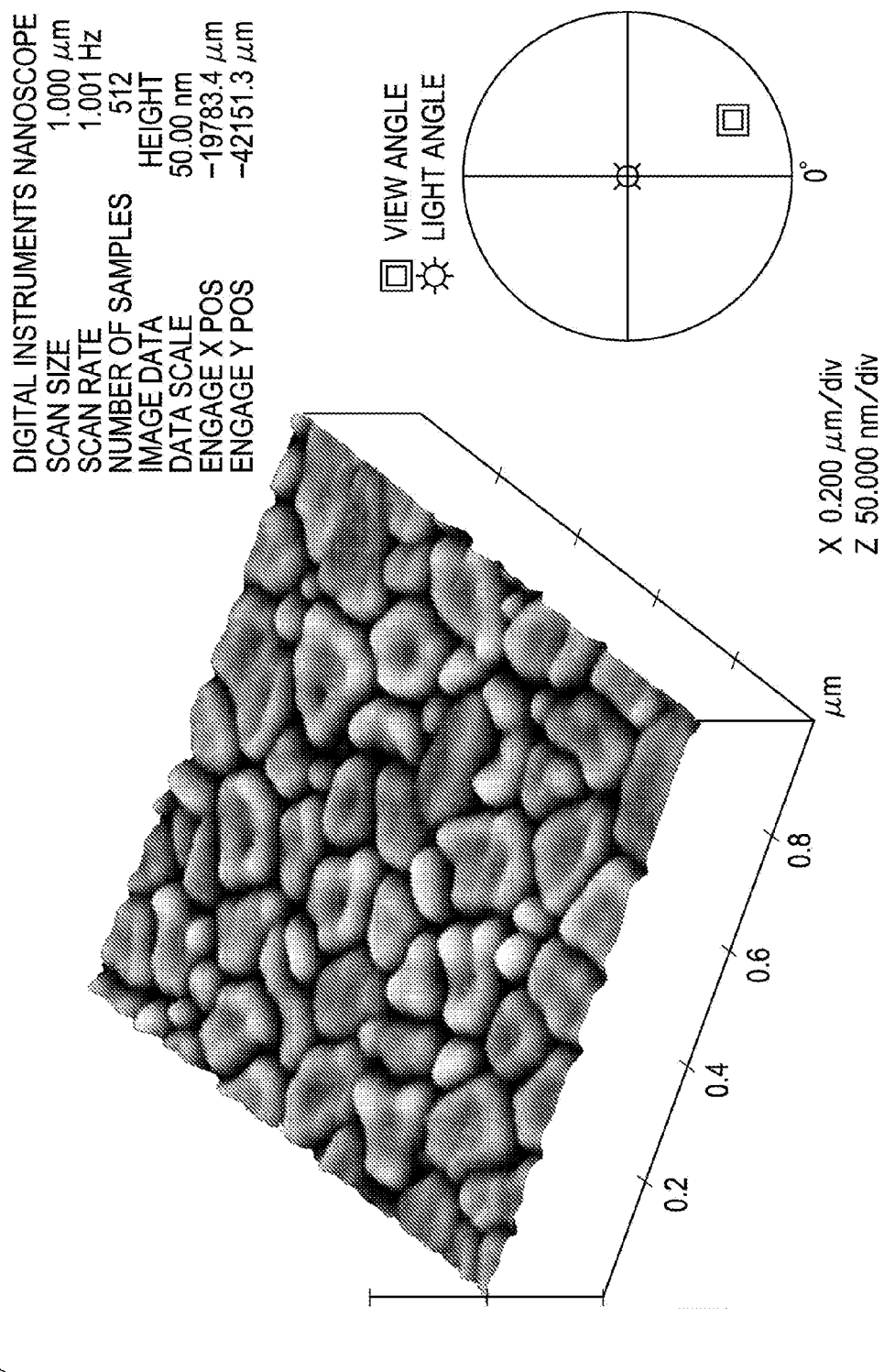
FIG. 12 is an AFM image of a piezoelectric layer of a piezoelectric element C.
Figure 13:
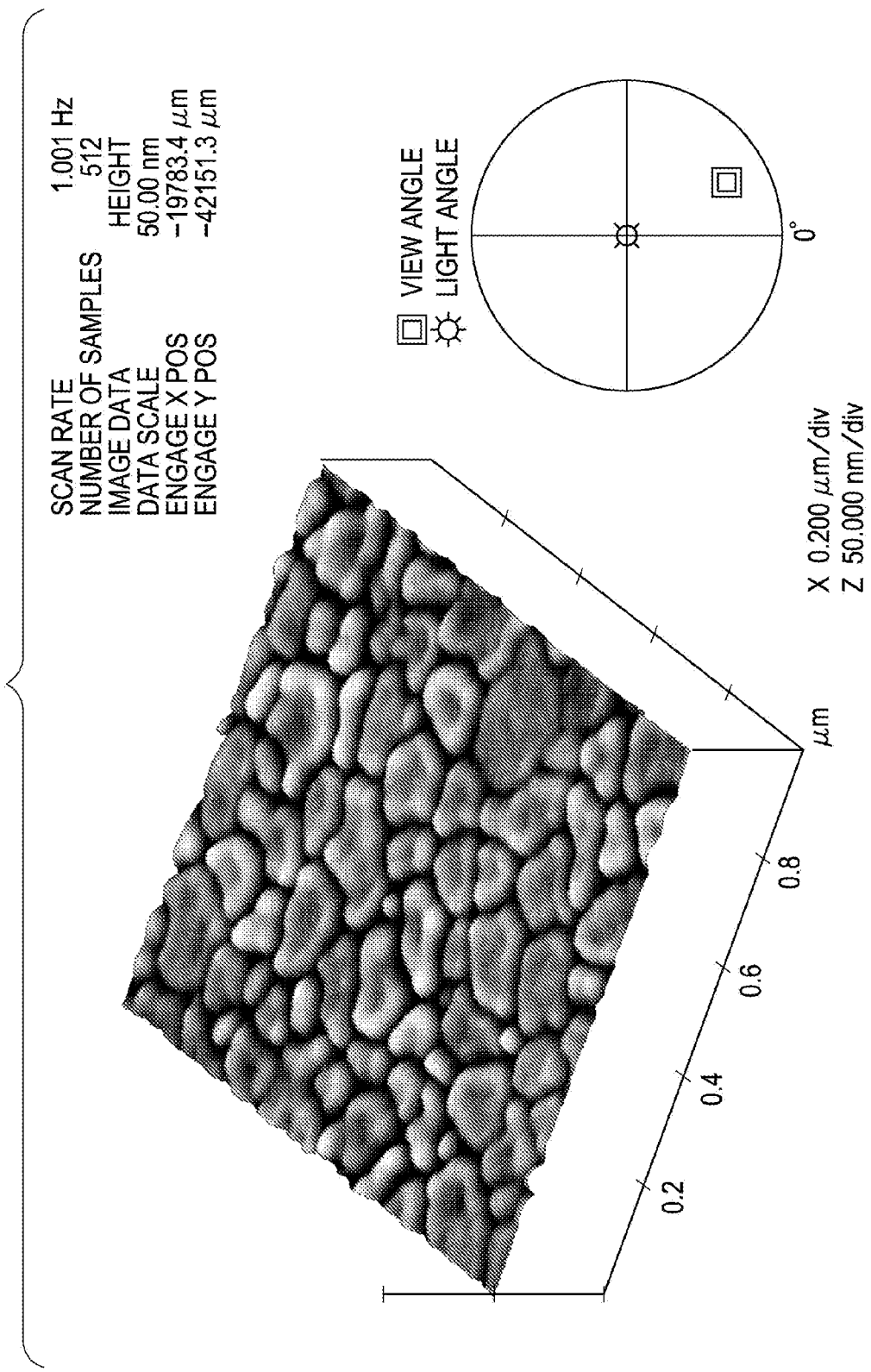
FIG. 13 is an AFM image of a piezoelectric layer of a piezoelectric element D.
Figure 14:
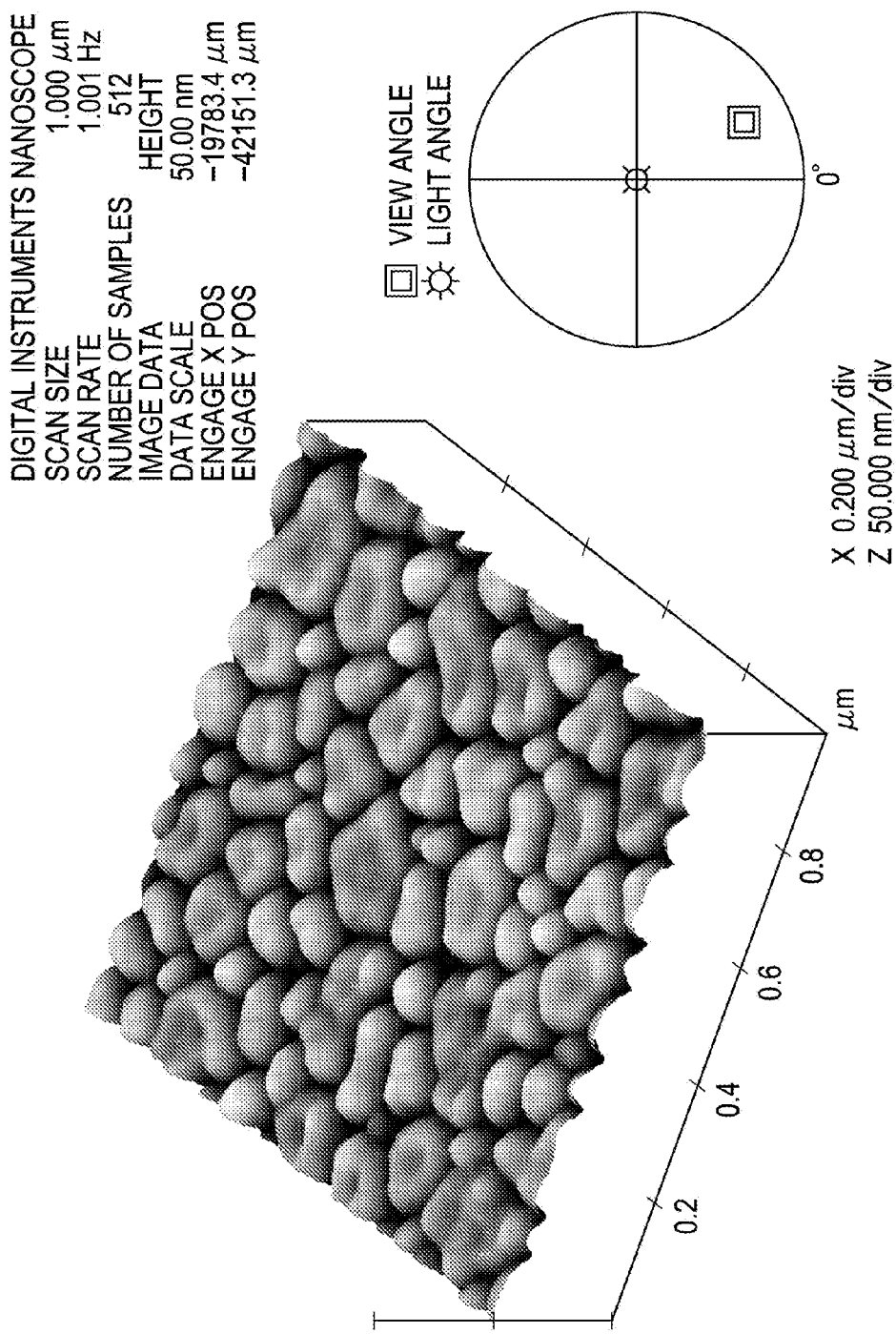
FIG. 14 is an AFM image of a piezoelectric layer of a piezoelectric element E.
Figure 15:
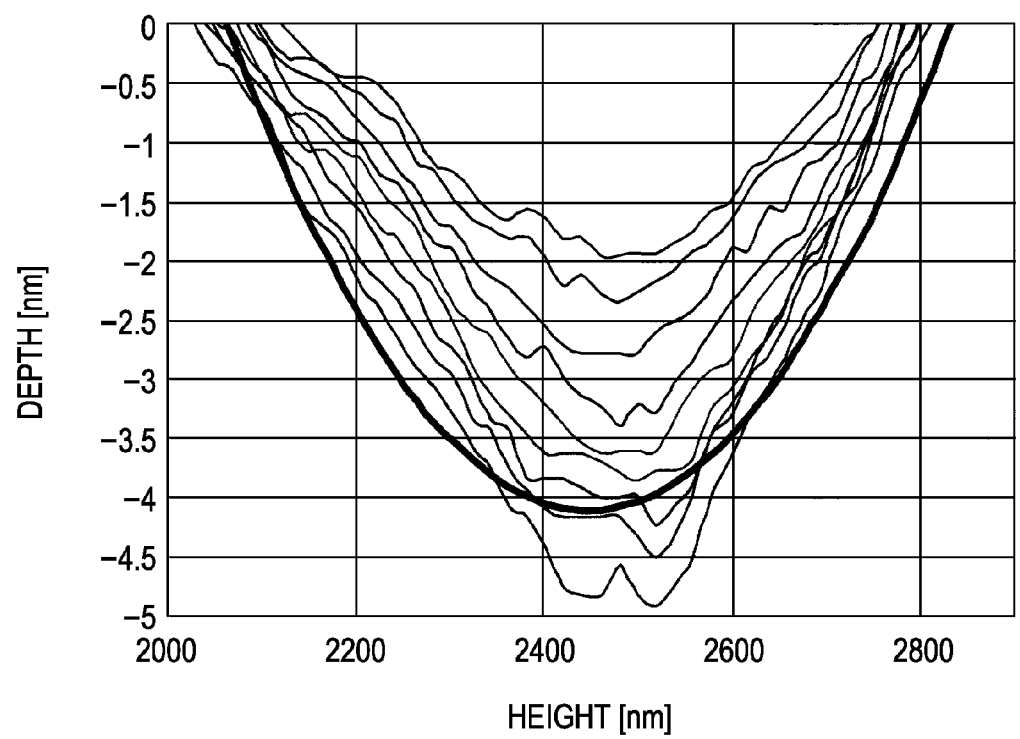
FIG. 15 is a graph illustrating an example of a measurement result of a groove portion of the piezoelectric layer of the piezoelectric element A.

At the stage where the piezoelectric layer 70 is formed, in regard to the surface of the side opposite to the first electrode 60 side of the piezoelectric layer 70 of each of the piezoelectric elements A to E, that is, the surface on the side where the second electrode is to be formed in a later process, the depth d and the width w of the groove portions 502 formed due to the adjacent grains 501 were measured by the conditions described below, and d/ρ was determined. The results are shown in Table 1. Also, an AFM image of the surface of the side of the piezoelectric layer 70 of each of the piezoelectric elements where the second electrode is to be formed shown in FIG. 10 is with regard to the piezoelectric element A, in FIG. 11 is with regard to the piezoelectric element B, in FIG. 12 is with regard to the piezoelectric element C, in FIG. 13 is with regard to the piezoelectric element D, and in FIG. 14 is with regard to the piezoelectric element E. Here, 100 locations were measured under the conditions below, d/ρ was determined for each of the groove portions 502, and the average values of these values are described in the Table 1 below. Here, as shown in FIG. 15 which is an example of a measurement result of the groove portion 502, it is understood that the elliptical approximation (shown by the thick line in FIG. 15) of the groove portion 502, which is carried out in the invention, is appropriate.

Measurement Conditions

Device name: Nanoscope III (manufactured by Digital Instruments Inc.)

AFM tip: NCH (tip shape: PointProbe with length of 125 μm, spring constant of 42 N/m, resonance frequency of 320 kHz)

Measurement mode: AC mode (tapping mode)

Measurement range: 5 μm×5 μm

Measurement resolution: 1064×1064

Next, on a section of the piezoelectric layer 70, the second electrode 80 was formed from iridium with a thickness of 50 nm by sputtering, and by patterning, the piezoelectric element 300 was formed. Here, the groove portions formed in the surface on the second electrode side of the piezoelectric layer at this stage have not changed in terms of shape or size from the groove portions before the forming of the second electrode which were measured as described above.

Figure 16:
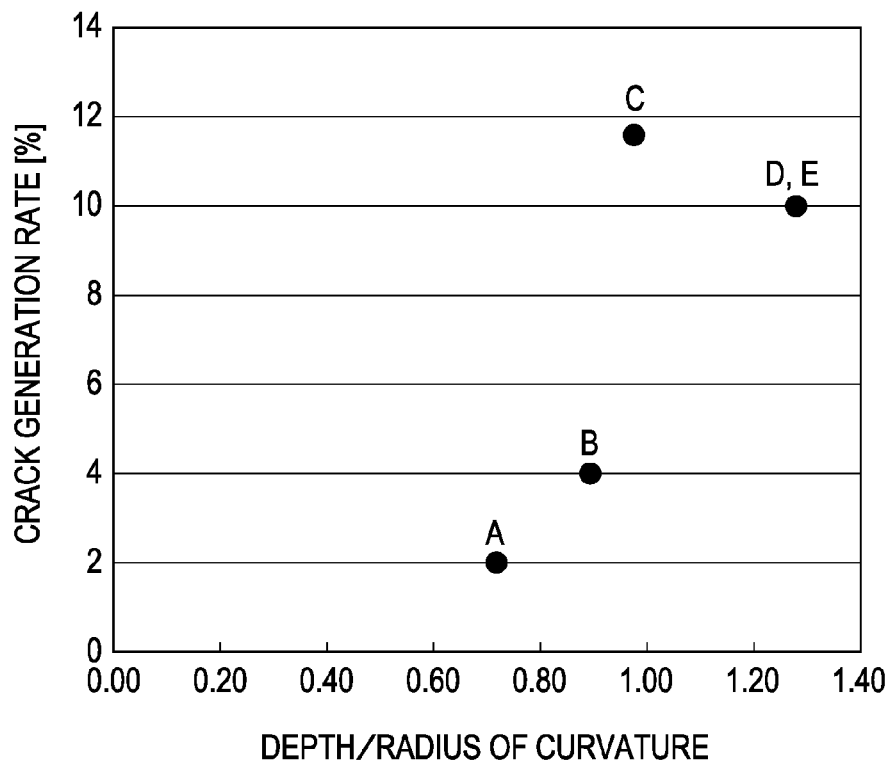
FIG. 16 is a graph illustrating results of generation rates of cracks.

Next, according to the embodiment described above, the ink jet recording head was formed and mounted in the ink jet recording apparatus. A plurality of the ink jet recording apparatuses were formed under the same conditions, and each was driven to discharge $10^{11}$ times at an applied voltage of 35 V to determine the rate at which cracks were generated (crack generation rate) over that period. The results are shown in Table 1 and FIG. 16.

As shown in Table 1, when comparing the piezoelectric elements A to E, there are differences in the depth and width of the groove portions 502 formed between the grains in the second electrode 80 side surface of the piezoelectric layers 70. Here, the characteristics other than the depth and width of the groove portions 502 such as the crystalline properties of the piezoelectric layer 70 are substantially the same. In addition, in the piezoelectric elements A and B where the groove portions 502 satisfy $0 \leq d/\rho \leq 0.900$, the generation rate of cracks was significantly lower compared to the piezoelectric elements C, D and E which were outside of the range where $0 \leq d/\rho \leq 0.900$.

TABLE 1

|  | Groove portions formed between grains | | | Generation rate of cracks [%] |
|---|---|---|---|---|
|  | Depth d [nm] | Width w [nm] | d/ρ | |
| Piezoelectric element A | 30 | 80 | 0.720 | 2 |
| Piezoelectric element B | 27 | 60 | 0.895 | 4 |
| Piezoelectric element C | 22 | 45 | 0.978 | 11.6 |
| Piezoelectric element D | 20 | 30 | 1.28 | 10 |
| Piezoelectric element E | 28 | 42 | 1.28 | 10 |

Here, from the results described above, if the groove portions 502 which exist between the grains 501 in the second electrode 80 side surface of the piezoelectric layer 70 satisfy $0 \leq d/\rho \leq 0.900$, it can be shown that the generation rate of cracks is significantly suppressed. However, the results are presumed to be as follows.

For example, if a voltage of 30 V is applied to the ink jet recording apparatus of the first embodiment described above, the film thickness of the piezoelectric layer changes from 1.3200 μm to 1.3238 μm. Here, the measurement of the film thickness of the piezoelectric layer is performed with a double beam laser interferometer (device name of DBL1-SE01, aixACCT Systems GmbH).

Also, the Young's modulus of the piezoelectric layer was 98 [Gpa] when measured by surface acoustic wave measurement (LAwave V5.2, ALOtec Dresden GmbH). Here, the density of PZT which forms the piezoelectric layer measured by XRD was 8.19 [g/cm$^3$].

Next, determining the stress of the piezoelectric layer from the percentage change in the film thickness and the Young's modulus of the piezoelectric layer gives a value of (1.3238-1.3200)/1.3200×98=282 [MPa].

From this value, determining the case when a voltage of 35 V is applied which is the driving voltage typically used for the liquid ejecting head gives a value of 282×35/30=329 [GPa]. In other words, if a voltage of 35 V is applied, an average stress of 329 [GPa] acts on the piezoelectric layer, that is, stress of 329 [GPa] acts on a flat portion of the piezoelectric layer.

Then, if the value of stress acting on a flat portion of the piezoelectric layer is multiplied by Inglis's elliptical defect stress concentration factor $(1+2\sqrt{d/\rho})$ calculated from the depth d and the width w of the groove portions between the grains, the maximum stress (described as "maximum stress when driving at 35 V" in Table 2), which acts on the piezoelectric layer when 35 V is applied, is determined as the stress acting on the groove portions between the grains. The determined stress is shown in Table

TABLE 2

|  | Groove depth d/ radius of curvature ρ | Maximum stress when driving at 35 V [MPa] | Log of maximum stress when driving at 35 V |
|---|---|---|---|
| Piezoelectric element A | 0.720 | 888 | 2.95 |
| Piezoelectric element B | 0.895 | 952 | 2.98 |
| Piezoelectric element C | 0.978 | 980 | 2.99 |
| Piezoelectric element D | 1.28 | 1074 | 3.03 |
| Piezoelectric element E | 1.28 | 1074 | 3.03 |

Figure 17:
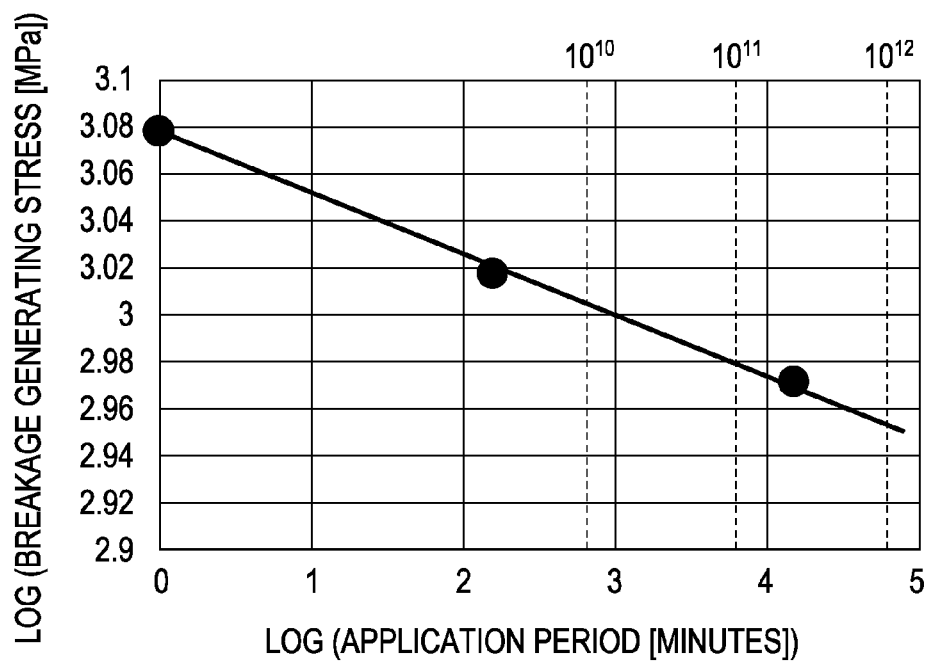
FIG. 17 is a graph illustrating a relationship between a period of voltage application and breakage generating stress in a piezoelectric layer.

Here, as shown in FIG. 17 which is a graph illustrating a relationship between a period of voltage application and breakage generating stress of the piezoelectric layer, the stress until breakage of the piezoelectric layer due to the generation of cracks varies due to the period of voltage application, that is, the number of discharges. Specifically, the logarithm of the application period and the logarithm of the breakage generating stress have a proportional relationship. In addition, as shown in FIG. 17, in order to provide an ink jet recording head which can endure discharging $10^{11}$ times which is a sufficient number of times as the number of times of discharge in the typical use of the ink jet recording head, it is necessary for the ink jet recording head to be used at a stress of 953 [MPa] (2.98 in logarithm form) or less. Comparing this value to the values in Table 2, it is aligned such that the maximum stress when driving at 35 V is 953 or less for the piezoelectric elements A and B, and also 980 and 1074 for the piezoelectric elements C and D, respectively.

Due to this, since d/ρ of the groove portions satisfies $0 \leq d/\rho \leq 0.900$, it is understood that the generation of cracks can be reliably suppressed at least at a number of discharges of $10^{11}$ times or less which is sufficient as the number of times of discharge of the liquid ejecting apparatus.

Other Embodiments

The first embodiment of the invention has been described above, but the basic configuration of the invention is not limited to that described above. For example, in the first embodiment described above, the piezoelectric layer 70 is formed with crystals in a column shape, but may be formed not using crystals with a column shape. Also, for example, in the embodiment described above, the flow path forming substrate 10 is exemplified as a single crystal silicon substrate, but is not particularly limited to this, and for example, an SOI substrate, or a material such as glass or the like may be used.

Figure 18:
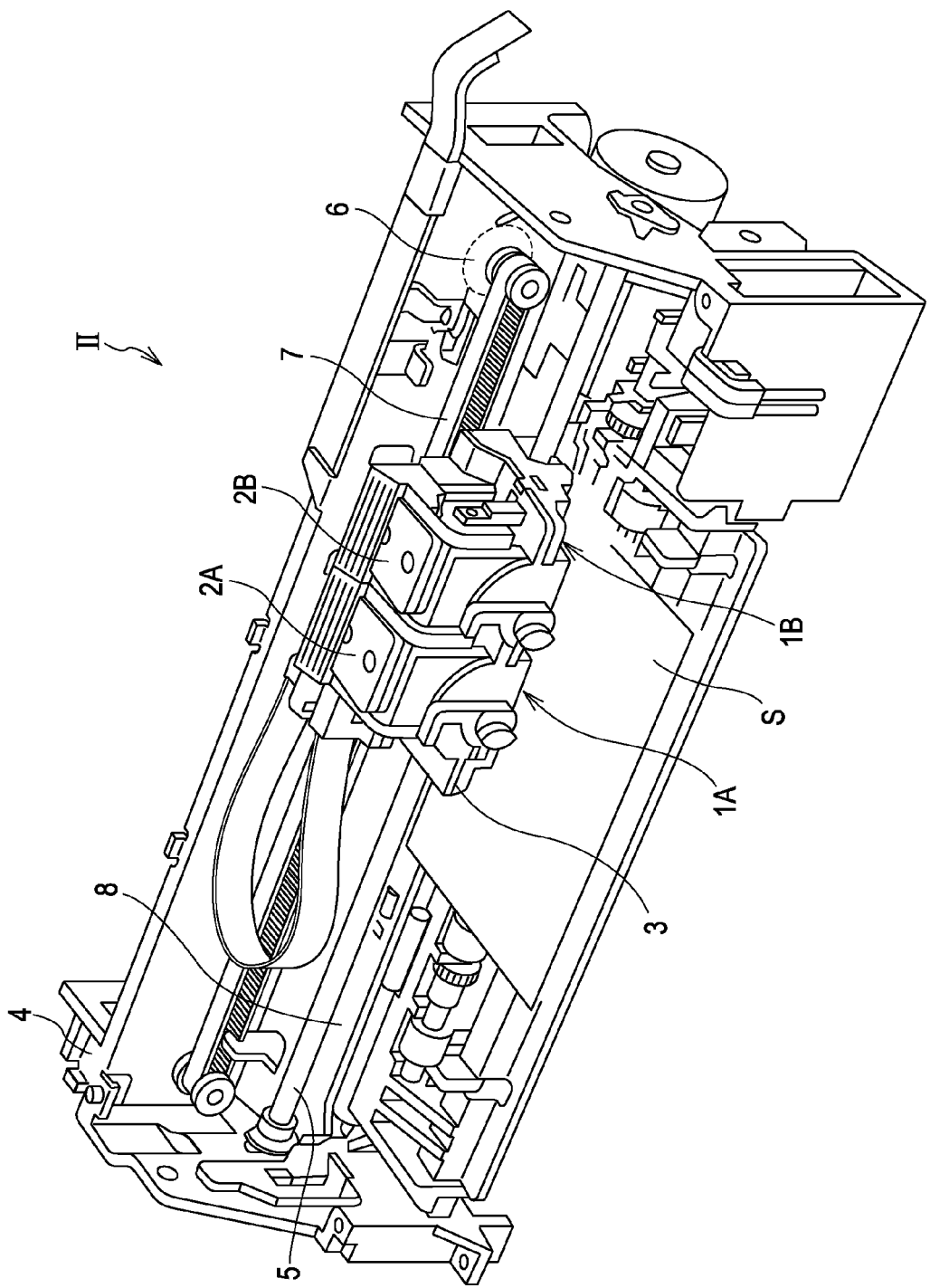
FIG. 18 is a diagram illustrating a schematic configuration of a recording apparatus according to an embodiment of the invention.

Furthermore, the ink jet recording head I configures a part of a recording head unit provided with an ink flow path which communicates with an ink cartridge and the like, and is mounted in the ink jet recording apparatus. FIG. 18 is a schematic diagram illustrating an example of the ink jet recording apparatus.

In regard to an ink jet recording apparatus II shown in FIG. 18, recording head units 1A and 1B with the ink jet recording head I are provided with cartridges 2A and 2B configured as an ink supply means so as to be able to be attached and detached, and a carriage 3 with the recording head units 1A and 1B mounted thereon is provided so as to be able to freely move in an axial direction of a carriage axis 5 attached to an apparatus main body 4. The recording head units 1A and 1B are each set to discharge, for example, a black ink composition and a color ink composition.

In addition, by transferring the driving force of a driving motor 6 to the carriage 3 via a plurality of gears (not shown)

and a timing belt 7, the carriage 3 with the recording head units 1A and 1B mounted thereon is moved along the carriage axis 5. On the other hand, in the apparatus main body 4, a platen 8 is provided along the carriage axis 5, and a recording sheet S, which is a recording medium such as paper or the like fed by a paper feeding roller or the like (not shown), is wound on the platen 8 and transported.

Also, in the first embodiment described above, as an example of the liquid ejecting head, an ink jet recording head was described, but according to the invention, it is possible for the invention to be applied to a broad range of liquid ejecting heads and is, of course, also appropriate for liquid ejecting heads ejecting liquids other than ink. As other liquid ejecting heads, for example, there are various types of recording heads used in image recording apparatuses such as printers and the like, coloring material ejecting heads used in the manufacturing of color filters for liquid crystal displays and the like, electrode material ejecting heads used in forming electrodes for organic EL displays, FEDs (field emission displays) and the like, bioorganic material ejecting heads used in manufacturing biochips, and the like.

What is claimed is:

1. A piezoelectric element comprising:
   a first electrode,
   a piezoelectric layer which contains lead, zirconium, and titanium, and which is formed above the first electrode, and
   a second electrode formed above the piezoelectric layer,
   wherein a groove which exists between grains in the second electrode side surface of the piezoelectric layer, satisfies $0 \leqq d/p \leqq 0.900$ (where d: depth of groove extending from the second electrode side surface of the piezoelectric layer towards a first electrode side surface, w: width of groove extending transverse to d, $\rho$: radius of curvature $(d^2+w^2/4)/2d$ ).

2. The piezoelectric element according to claim 1, wherein the thickness of the piezoelectric layer is 6 μm or less.

3. A liquid ejecting head comprising the piezoelectric element according to claim 1.

4. A liquid ejecting apparatus comprising the liquid ejecting head according to claim 3.

\* \* \* \* \*